United States Patent
Mao et al.

(10) Patent No.: US 9,918,416 B2
(45) Date of Patent: Mar. 13, 2018

(54) ELECTROMAGNETIC INTERFERENCE SHIELD

(71) Applicant: FINISAR CORPORATION, Sunnyvale, CA (US)

(72) Inventors: Yandong Mao, Shanghai (CN); Xiaojun Zeng, Shanghai (CN); Niles Zhao, Shanghai (CN)

(73) Assignee: FINISAR CORPORATION, Sunnvale, CA (US)

( * ) Notice: Subject to any disclaimer, the term of this patent is extended or adjusted under 35 U.S.C. 154(b) by 179 days.

(21) Appl. No.: 14/606,721

(22) Filed: Jan. 27, 2015

(65) Prior Publication Data

US 2016/0192545 A1    Jun. 30, 2016

(30) Foreign Application Priority Data

Dec. 26, 2014 (CN) .......................... 2014 1 0832025

(51) Int. Cl.
| | |
|---|---|
| *H04B 10/00* | (2013.01) |
| *H05K 9/00* | (2006.01) |
| *H04B 10/40* | (2013.01) |
| *G02B 6/42* | (2006.01) |

(52) U.S. Cl.
CPC ......... *H05K 9/0058* (2013.01); *G02B 6/4246* (2013.01); *G02B 6/4277* (2013.01); *H04B 10/40* (2013.01); *G02B 6/4292* (2013.01)

(58) Field of Classification Search
CPC .. H05K 9/0058; G02B 6/4246; G02B 6/4277; G02B 6/4292; H04B 10/40
USPC ........................................................ 398/136
See application file for complete search history.

(56) References Cited

U.S. PATENT DOCUMENTS

| | | | | | |
|---|---|---|---|---|---|
| 4,647,148 | A | * | 3/1987 | Katagiri | H01L 31/0203 250/239 |
| 5,335,147 | A | * | 8/1994 | Weber | H05K 9/0062 174/359 |
| 5,495,399 | A | * | 2/1996 | Gore | H05K 9/0032 174/354 |
| 5,535,034 | A | * | 7/1996 | Taniguchi | G02B 6/4246 398/117 |
| 6,319,062 | B1 | * | 11/2001 | Ma | H01R 24/64 439/490 |
| 6,749,448 | B2 | * | 6/2004 | Bright | G02B 6/4201 439/152 |

(Continued)

OTHER PUBLICATIONS

IBM, "Optical Fiber Link Card Retainer/Holder" IPCOM000101558D | IBM TDB Archive, Aug. 1, 1990, IBM Technical Disclosure Bulletin (TDB n3b 08-90 p. 84-87).*

(Continued)

Primary Examiner — Juan A Torres
(74) Attorney, Agent, or Firm — Maschoff Brennan

(57) ABSTRACT

An electromagnetic interference (EMI) shield may include a first shield section configured to be positioned on a first portion of an optical subassembly and a second shield section configured to be positioned on a second portion of the optical subassembly. The first shield section may be configured to contact the second shield section such that the first shield section and the second shield section are held in place when the first shield section and the second shield section are positioned, respectively, on the first portion and the second portion of the optical subassembly.

14 Claims, 12 Drawing Sheets

(56) References Cited

U.S. PATENT DOCUMENTS

| | | | | |
|---|---|---|---|---|
| 6,966,797 B2* | 11/2005 | Ko | ............... | H01R 13/65802 439/607.42 |
| 7,300,215 B2* | 11/2007 | Hsiao | ............... | G02B 6/4292 385/139 |
| 7,367,719 B1* | 5/2008 | Liburdi | ............... | G02B 6/4201 385/89 |
| 7,917,037 B2* | 3/2011 | Liu | ............... | G02B 6/4277 398/135 |
| 8,550,848 B2* | 10/2013 | Wu | ............... | H01R 13/6583 439/353 |
| 2007/0267577 A1* | 11/2007 | Kindem | ............... | G01T 1/2018 250/370.15 |
| 2008/0145006 A1* | 6/2008 | Ice | ............... | G02B 6/4201 385/93 |
| 2009/0028557 A1* | 1/2009 | Togami | ............... | H05K 9/0058 398/39 |
| 2009/0211801 A1* | 8/2009 | Edwards | ............... | H05K 9/0058 174/377 |
| 2010/0098427 A1* | 4/2010 | Ice | ............... | G02B 6/4246 398/135 |
| 2011/0311188 A1* | 12/2011 | Wang | ............... | G02B 6/3817 385/94 |
| 2012/0148201 A1* | 6/2012 | Kondou | ............... | G02B 6/4245 385/92 |
| 2013/0071072 A1* | 3/2013 | Xie | ............... | G02B 6/4277 385/92 |
| 2014/0196943 A1* | 7/2014 | Hirschy | ............... | G02B 6/4246 174/382 |
| 2014/0202755 A1* | 7/2014 | Ito | ............... | H05K 9/0018 174/359 |

OTHER PUBLICATIONS

IBM, "EMI Shielding for High Performance Optoelectronic Transceiver through Utilization of Electrically Conductive Gasket and Laser Welding" IBM TDB Archive, Jun. 1, 1994, IBM Technical Disclosure Bulletin (TDB v37 n6B 06-94 p. 127-128).*

* cited by examiner

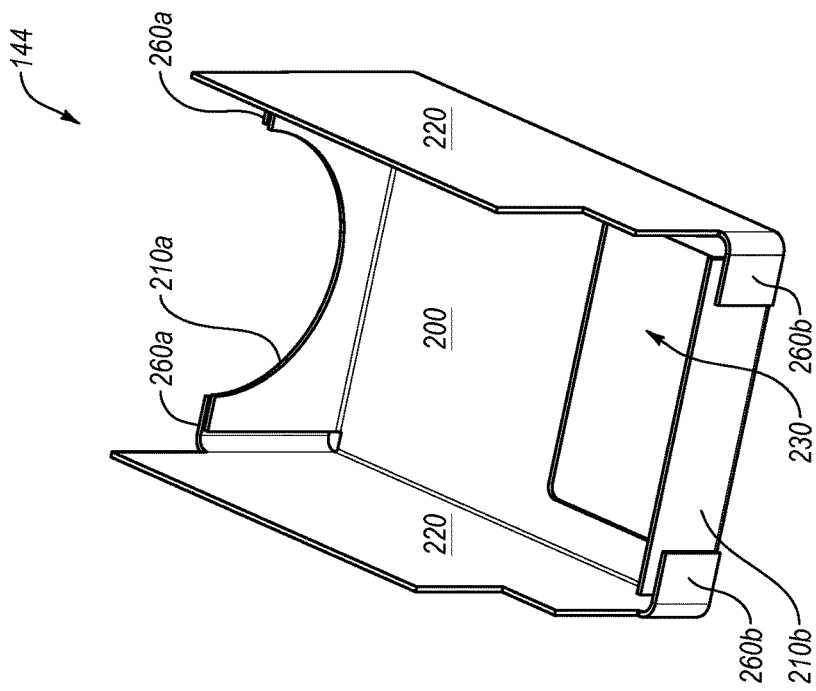
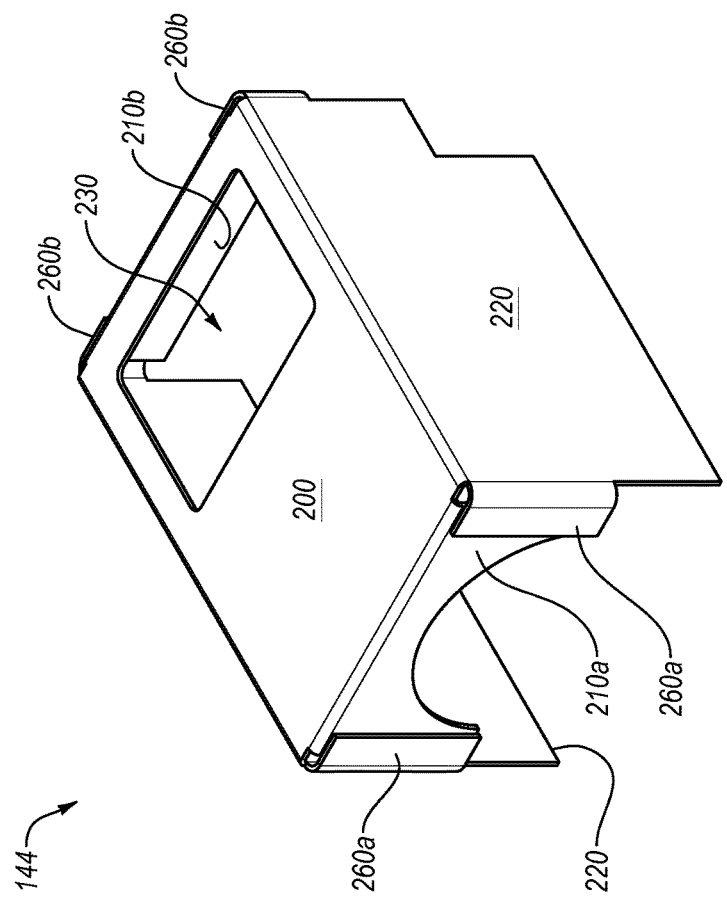

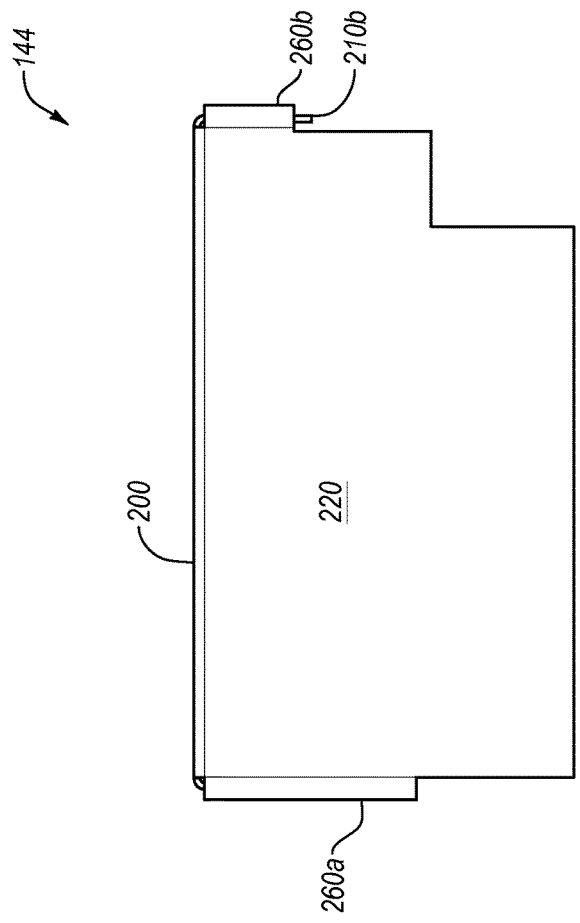
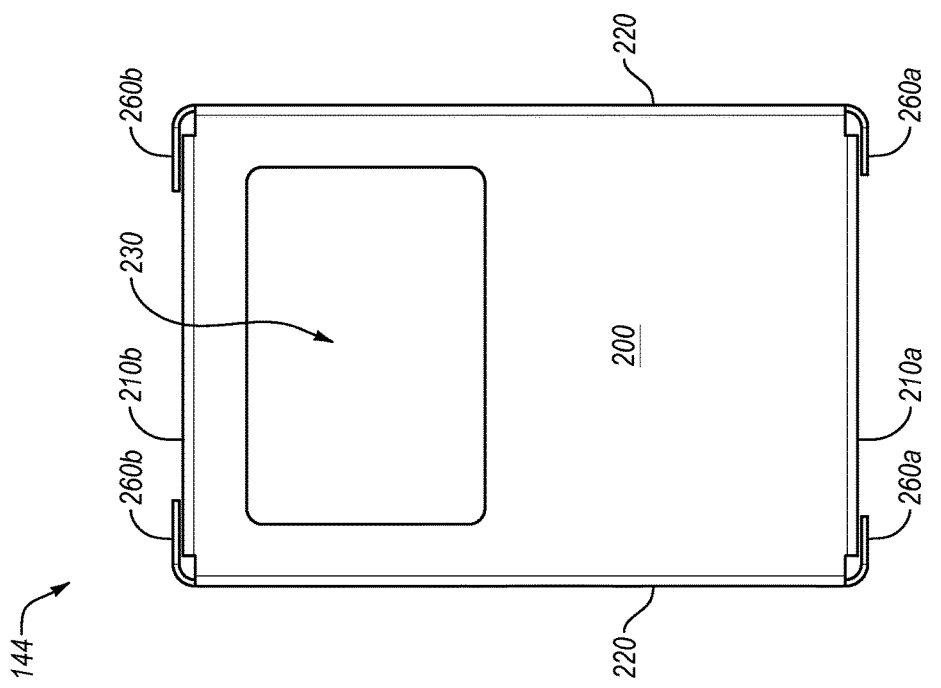

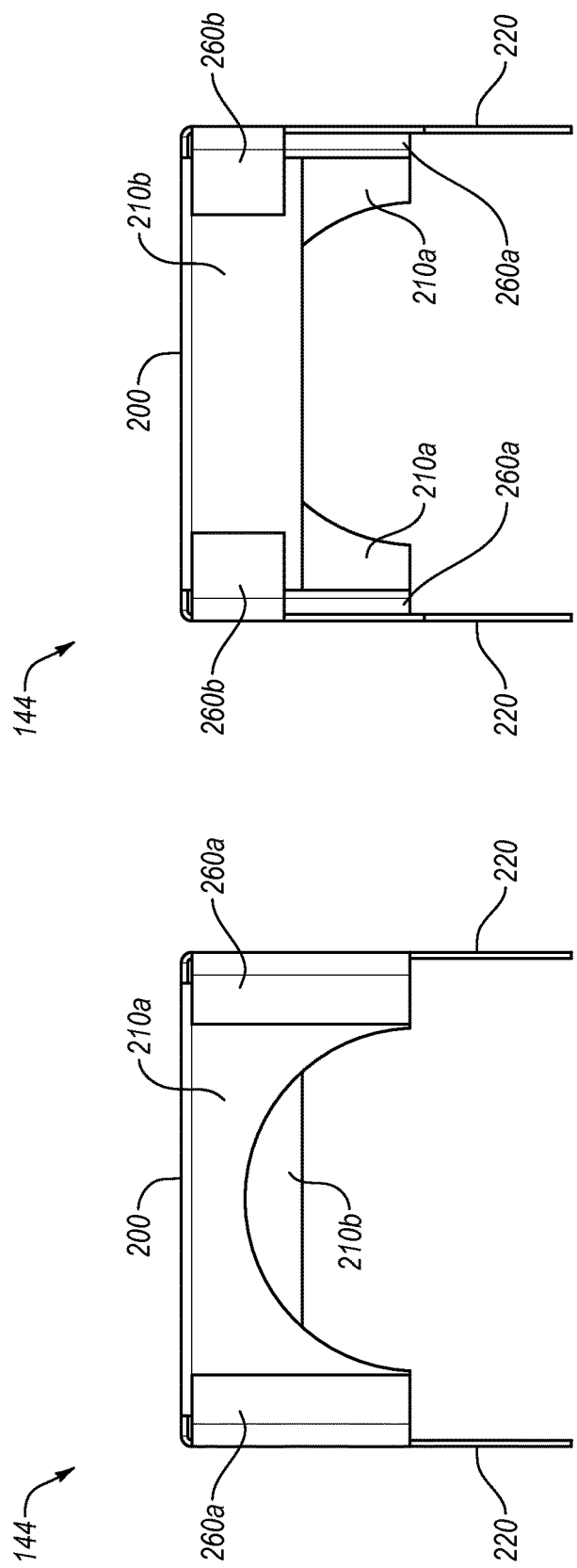

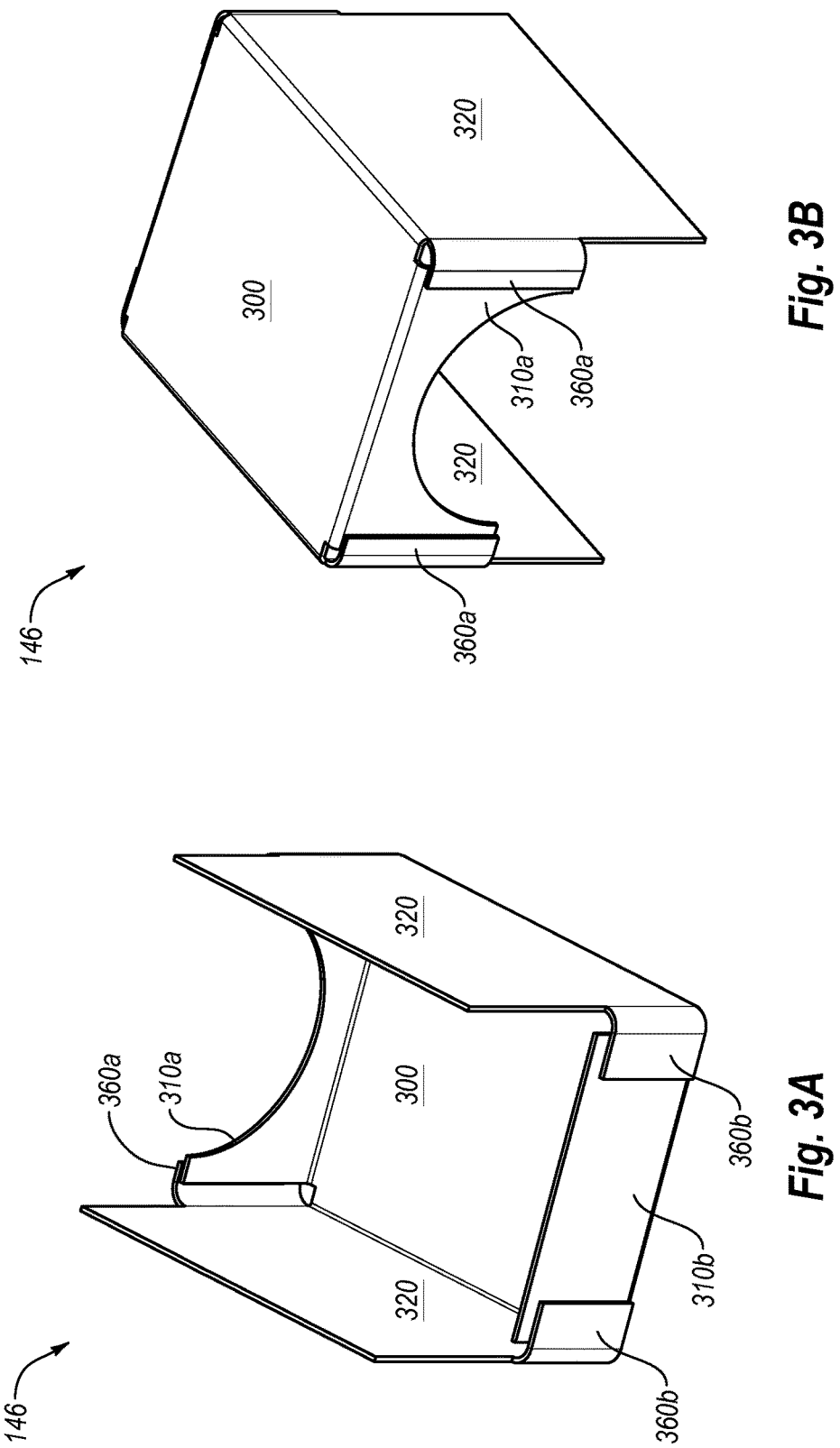

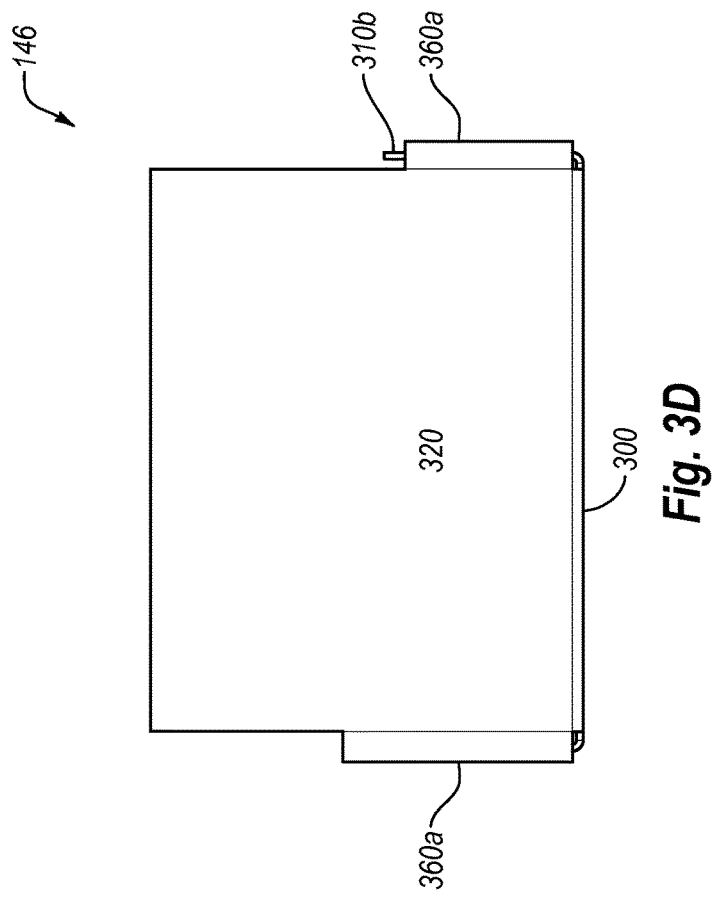
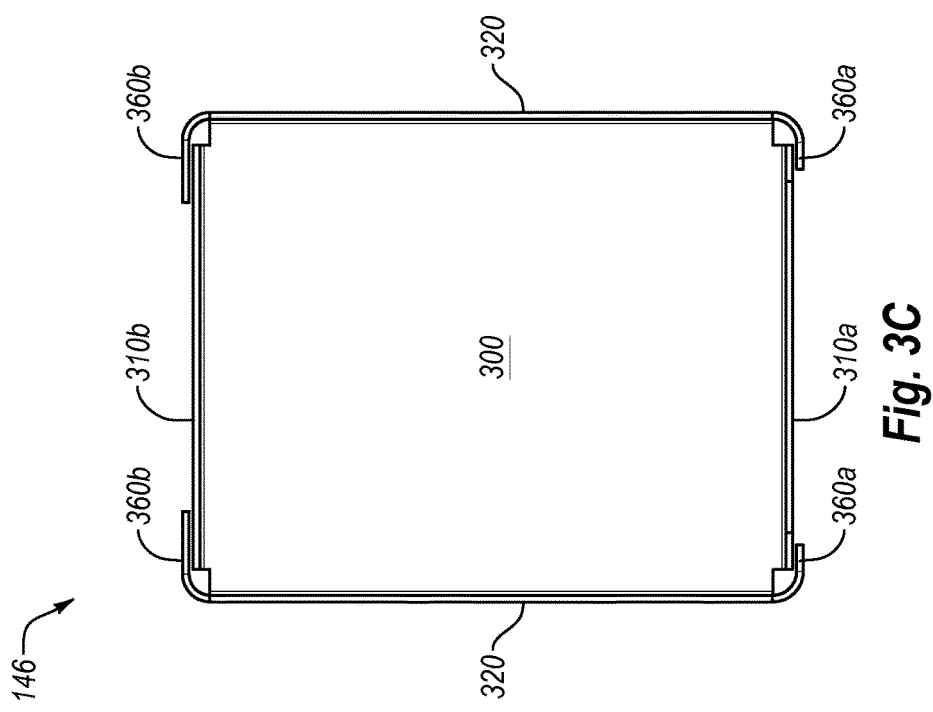
Fig. 3D
Fig. 3C

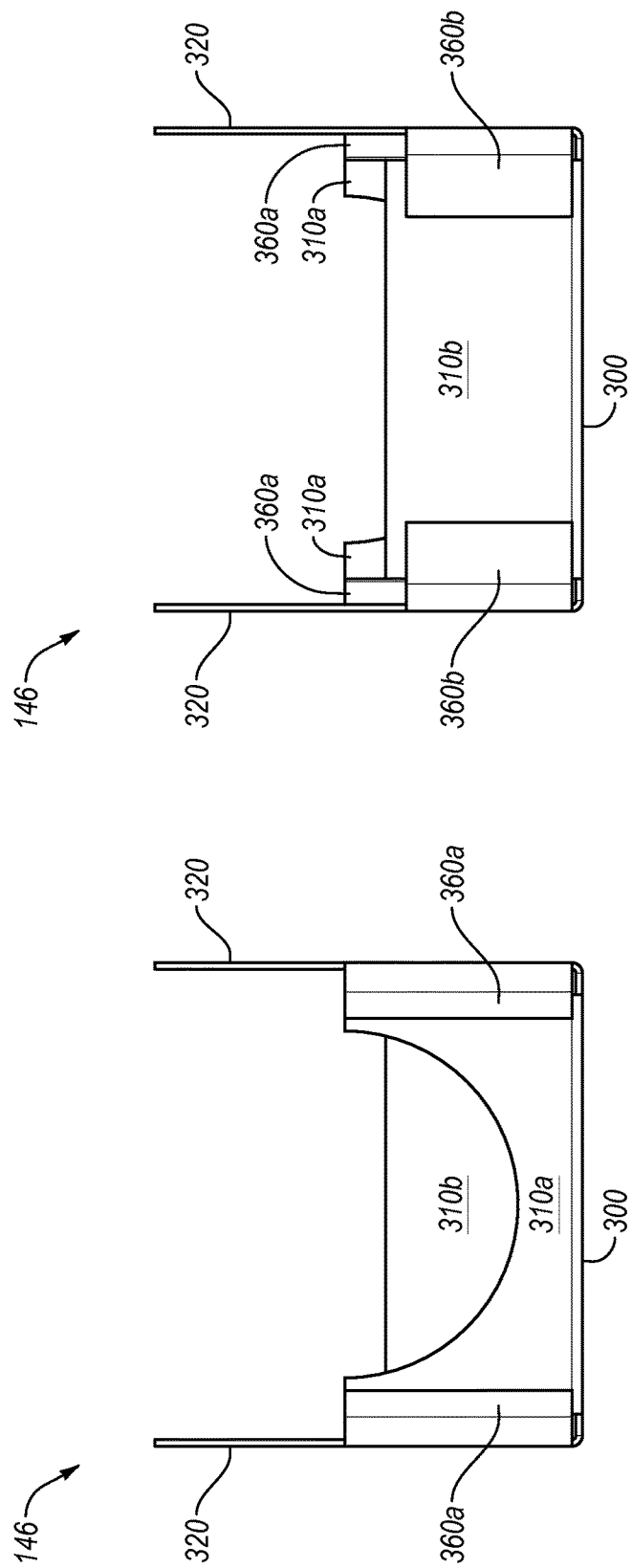

ELECTROMAGNETIC INTERFERENCE SHIELD

CROSS-REFERENCE TO RELATED APPLICATIONS

This patent application claims priority to Chinese Patent Application No. 201410832025.8, filed Dec. 26, 2014, which is incorporated herein by reference in its entirety.

BACKGROUND

Some embodiments described herein relate to optoelectronic transceiver modules and other communication devices. More particularly, some embodiments may relate to shields configured to be positioned on optical subassemblies located within optoelectronic transceiver modules to reduce electromagnetic interference (EMI) emitted by and/or experienced by the optical subassemblies.

Communication modules, such as optoelectronic transceiver modules, may include various components that engage in the transmission and reception of optical signals. Some of the components may be housed within a shell of the optical transceiver module. Examples of such components may include a transmitter optical subassembly (TOSA) and/or a receiver optical subassembly (ROSA). The optical transceiver module itself is operably received within a host device that serves as one component of a communications network.

To engage in optical communication with other communications modules, the optoelectronic transceiver module may operably connect with a connectorized optical fiber. The optoelectronic transceiver module may include a transmit port and/or a receive port configured to receive the connector of the optical fiber. Optical signals may be received and/or transmitted by the optoelectronic transceiver module via the optical fiber.

Optical signals received by the optoelectronic transceiver module may be converted to electrical signals. Conversely, the optoelectronic transceiver module may convert electrical signals to optical signals for transmission. During operation, components of the optoelectronic transceiver module may produce and emit electromagnetic fields, or EMI, that may interfere with the operation of other components within and/or external to the optoelectronic transceiver module, particularly while the components operate at high frequencies.

SUMMARY

In an example embodiment, an electromagnetic interference (EMI) shield may include a first shield section configured to be positioned on a first portion of an optical subassembly and a second shield section configured to be positioned on a second portion of the optical subassembly. The first shield section may be configured to contact the second shield section such that the first shield section and the second shield section are held in place when the first shield section and the second shield section are positioned, respectively, on the first portion and the second portion of the optical subassembly.

In another example embodiment, an optoelectronic transceiver module includes a transceiver body, a transmitter optical subassembly (TOSA), a cover, and an EMI shield. The transceiver body may include a shell and a cavity formed in the shell. The TOSA may be connected to the transceiver body by way of a connector block. The cover may be configured to cover the cavity and attach to the shell. The EMI shield may at least partially cover the TOSA. The EMI shield may include a first shield section configured to be positioned on a first portion of the TOSA and a second shield section configured to be positioned on a second portion of the TOSA. The first shield section may be configured to contact the second shield section such that the first shield section and the second shield section are held in place when the first shield section and the second shield section are positioned, respectively, on the first portion and the second portion of the TOSA.

In another example embodiment, an EMI shield includes a first shield section and a second shield section. The first shield section may be configured to be positioned on a first portion of an optical subassembly. The first shield section may include a first base, a first pair of arms located on the first base, a first pair of flanges located on the first base, and a first plurality of fingers located on the first pair of arms. The first pair of arms may be configured to be at least partially positioned on opposite sides of the optical subassembly. The first pair of flanges may be configured to be at least partially positioned on a front and a back of the optical subassembly. The first plurality of fingers may be positioned over the first pair of flanges. The second shield section may include a second base, a second pair of arms located on the second base, a second pair of flanges located on the second base, and a second plurality of fingers located on the second pair of arms. The second pair of arms may be configured to be at least partially positioned on opposite sides of the optical subassembly. The second pair of flanges may be configured to be at least partially positioned on a front and a back of the optical subassembly. The second plurality of fingers may be positioned over the second pair of flanges. The first shield section and the second shield section may be together configured to form a press fit.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the concepts will be set forth in the following description, and in part will be obvious from the description, or may be learned by the practice of the embodiments. The features and advantages of the embodiments may be realized and obtained by means of the instruments and combinations particularly pointed out in the appended claims. These and other features of the embodiments will become more fully apparent from the following description and appended claims, or may be learned by the practice of the embodiments as set forth hereinafter.

BRIEF DESCRIPTION OF THE DRAWINGS

To further clarify the above and other advantages and features of the embodiments, a more particular description of example embodiments will be rendered by reference to the appended drawings. These drawings depict only example embodiments and are therefore not limiting. The example embodiments will be described and explained with additional specificity and detail through the use of the accompanying drawings in which:

FIG. 2A shows a top perspective view of a first shield section;

FIG. 2B shows a bottom perspective view of the first shield section of FIG. 2A;

FIG. 2C shows a top view of the first shield section of FIG. 2A;

FIG. 2D shows a side view of the first shield section of FIG. 2A;

FIG. 2E shows a front view of the first shield section of FIG. 2A;

FIG. 2F shows a back view of the first shield section of FIG. 2A;

FIG. 3A shows a top perspective view of a second shield section of the EMI shield of FIG. 1D;

FIG. 3B shows a bottom perspective view of the second shield section of FIG. 3A;

FIG. 3C shows a top view of the second shield section of FIG. 3A;

FIG. 3D shows a side view of the second shield section of FIG. 3A;

FIG. 3E shows a front view of the second shield section of FIG. 3A;

FIG. 3F shows a back view of the second shield section of FIG. 3A;

DESCRIPTION

Figure 1A:
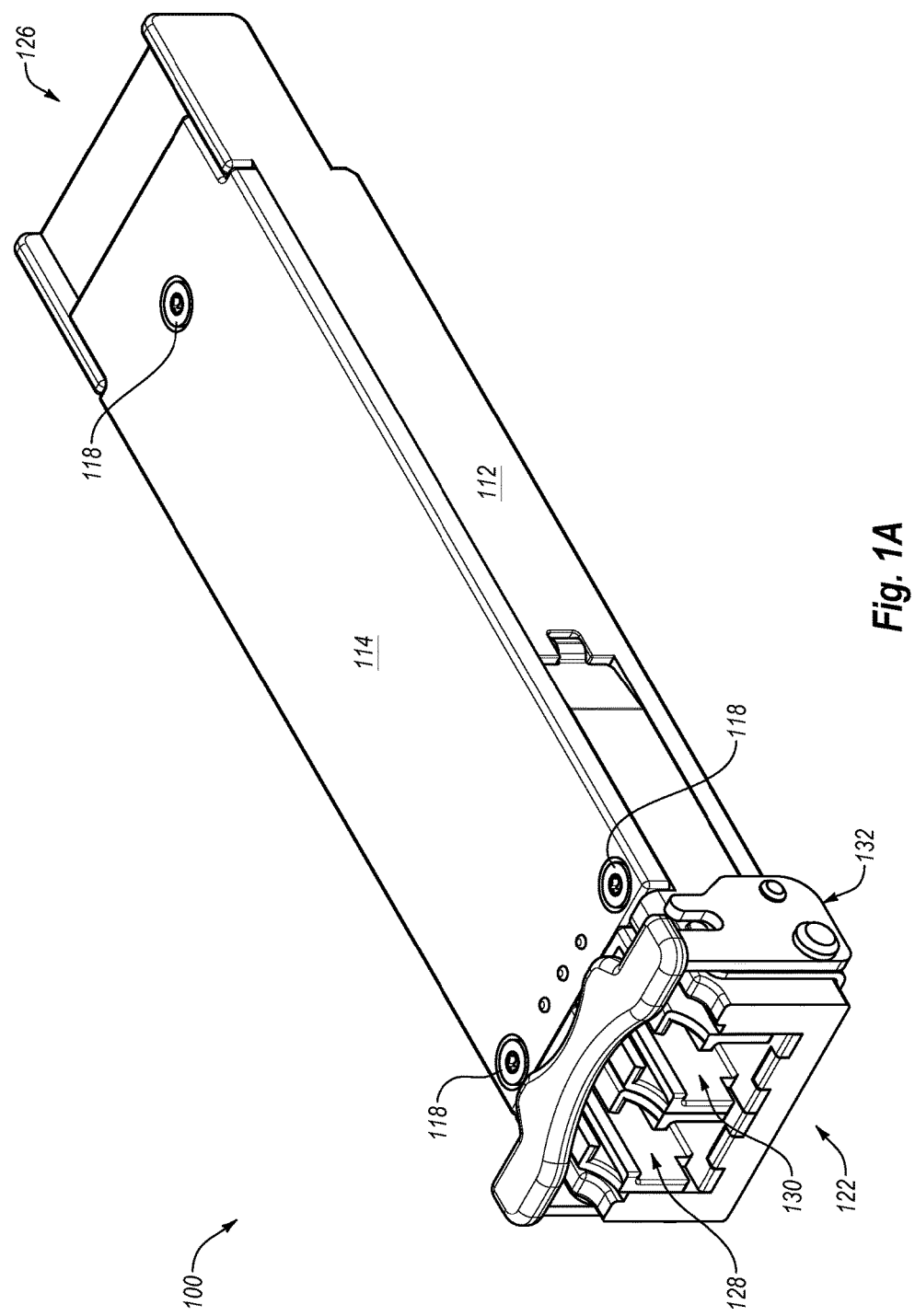
FIG. 1A shows a perspective view of an example optoelectronic transceiver module.

Some embodiments described herein relate to optoelectronic transceiver modules and other communication devices. More particularly, some embodiments may relate to shields configured to be positioned on optical subassemblies located within optoelectronic transceiver modules to reduce electromagnetic interference (EMI) emitted by and/or experienced by the optical subassemblies.

Communication modules, such as optoelectronic transceiver modules, may include various components that engage in the transmission and reception of optical signals. Some of the components may be housed within a shell of the optical transceiver module. Examples of such components may include a transmitter optical subassembly (TOSA) and/or a receiver optical subassembly (ROSA). The optical transceiver module itself is operably received within a host device that serves as one component of a communications network.

To engage in optical communication with other communications modules, the optoelectronic transceiver module may operably connect with a connectorized optical fiber. The optoelectronic transceiver module may include a transmit port and/or a receive port configured to receive the connector of the optical fiber. Optical signals may be received and/or transmitted by the optoelectronic transceiver module via the optical fiber.

Optical signals received by the optoelectronic transceiver module may be converted to electrical signals. Conversely, the optoelectronic transceiver module may convert electrical signals to optical signals for transmission. During operation, components of the optoelectronic transceiver module may produce and emit electromagnetic fields, or EMI, that may interfere with the operation of other components within and/or external to the optoelectronic transceiver module, particularly while the components operate at high frequencies.

Conventionally, in an attempt to control the EMI emitted by the components and/or the optoelectronic transceiver module, an EMI paste may be applied to an EMI-producing component. However, the quality and the uniformity of the EMI paste may be difficult to control. Furthermore, the EMI paste may potentially contaminate other parts within the optoelectronic transceiver module.

In place of, or in addition to using EMI paste, in some embodiments, a conductive EMI shield may be positioned on an EMI-producing component to reduce the EMI emitted from the component and the optoelectronic transceiver module. For example, the EMI shield may be positioned on an EMI-producing portion of a TOSA. Alternately or additionally, an EMI shield may be positioned on an EMI-sensitive component to reduce the EMI experienced by the component.

In some embodiments, the EMI shield may include two shield sections, each formed from a sheet metal stamping. Each of the shield sections may be sized and shaped to be positioned on opposite portions of the component. In some embodiments, the shield sections may be configured to fit together when positioned on the component such that the shield sections are held in place on the component. For example, a portion of one of the shield sections may be positioned over a portion of the other shield section to form a press fit. Alternately or additionally, the shield sections may be held together in other ways, such as with other interference fits, interlocking features, or the like. In some embodiments, the EMI shield may be configured to be positioned on the component such that the housing of the transceiver module acts to further hold the shield sections together and/or in position on the component.

Reference will now be made to the figures wherein like structures will be provided with like reference designations. The drawings are non-limiting, diagrammatic, and schematic representations of example embodiments, and are not necessarily drawn to scale.

The figures depict various features of example embodiments, generally directed to an EMI shield located within an optoelectronic transceiver module for controlling EMI emitted by and/or experienced by components of the optoelectronic transceiver module. In some embodiments, the EMI shield may be configured to be positioned on an optical subassembly to reduce the EMI produced by the optical subassembly.

Figure 1B:
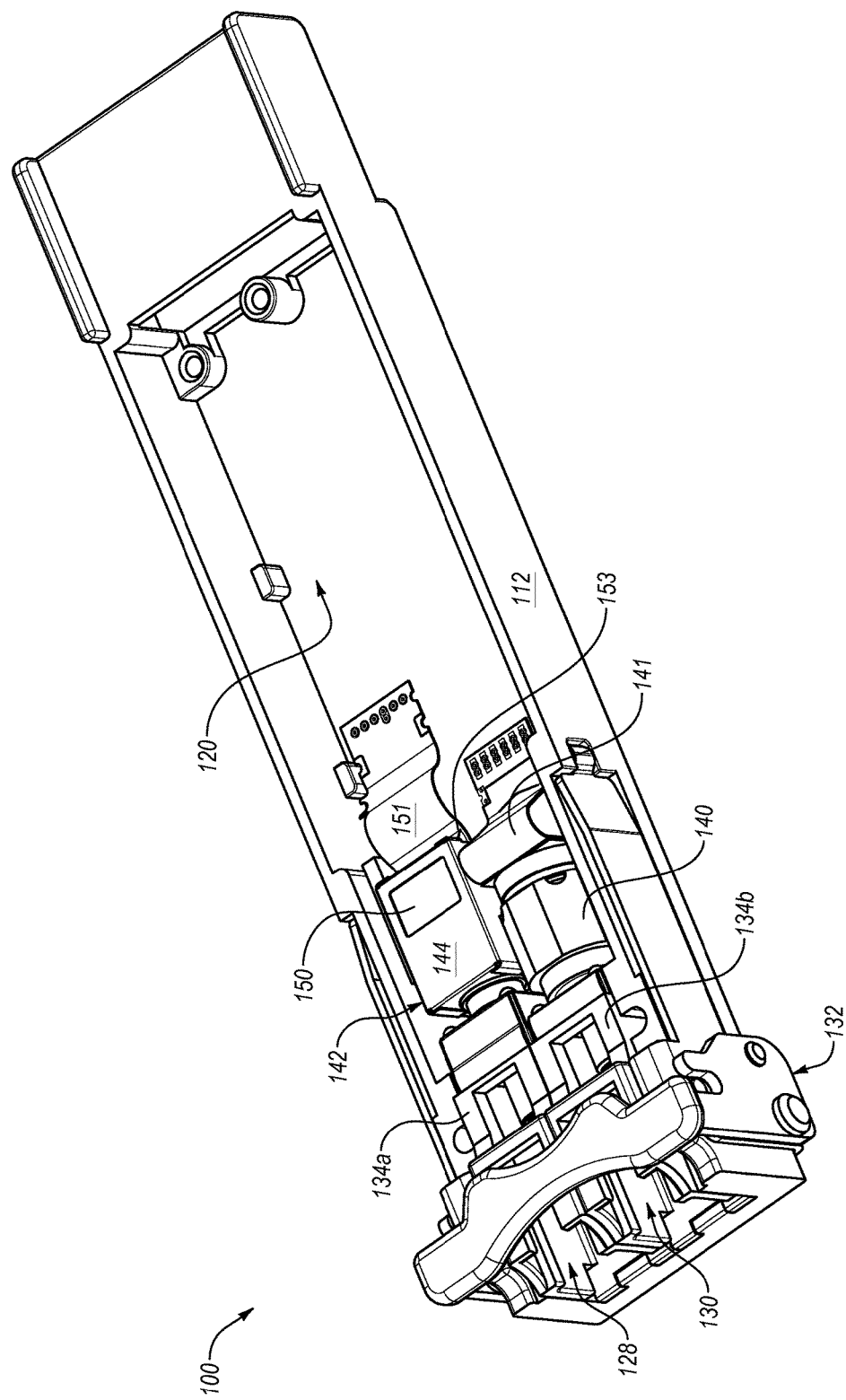
FIG. 1B shows a partially exploded perspective view of the optoelectronic transceiver module of FIG. 1A.

FIG. 1A shows a perspective view of an example optoelectronic transceiver module 100 (hereinafter "transceiver 100"). FIG. 1B shows a partially exploded perspective view of the transceiver 100.

With combined reference to FIGS. 1A and 1B, the transceiver 100 includes a transceiver body including a shell 112 and a cover 114. The shell 112 and the cover 114 may be shaped to form a cavity 120 (shown in FIG. 1B) to house various components of the transceiver 100. The shell 112 and the cover 114 may be joined together by screws 118. Alternatively or additionally, other fastening means may be used to join the shell 112 and the cover 114. The transceiver 100 may optionally include a latching mechanism 132 configured to allow the transceiver 100 to be selectively secured within a receptacle of a host device (not shown) so as to enable the transceiver 100 to operate with the host device.

The transceiver 100 includes a front end 122 (shown in FIG. 1A) and a rear end 126 (shown in FIG. 1A). A transmit port 128 and a receive port 130 may be located at the front end 122. A connector block 134a (shown in FIG. 1B) and a connector block 134b (shown in FIG. 1B, collectively "the connector blocks 134") may define, respectively, the transmit port 128 and the receive port 130.

The transceiver 100 may house a TOSA 150 and a ROSA 140 within the cavity 120. The TOSA 150 may be connected to the connector block 134a such that the TOSA 150 is in optical communication with the transmit port 128. The ROSA 140 may be connected to the connector block 134b such that the ROSA 140 is in optical communication with the receive port 130.

Figure 1C:
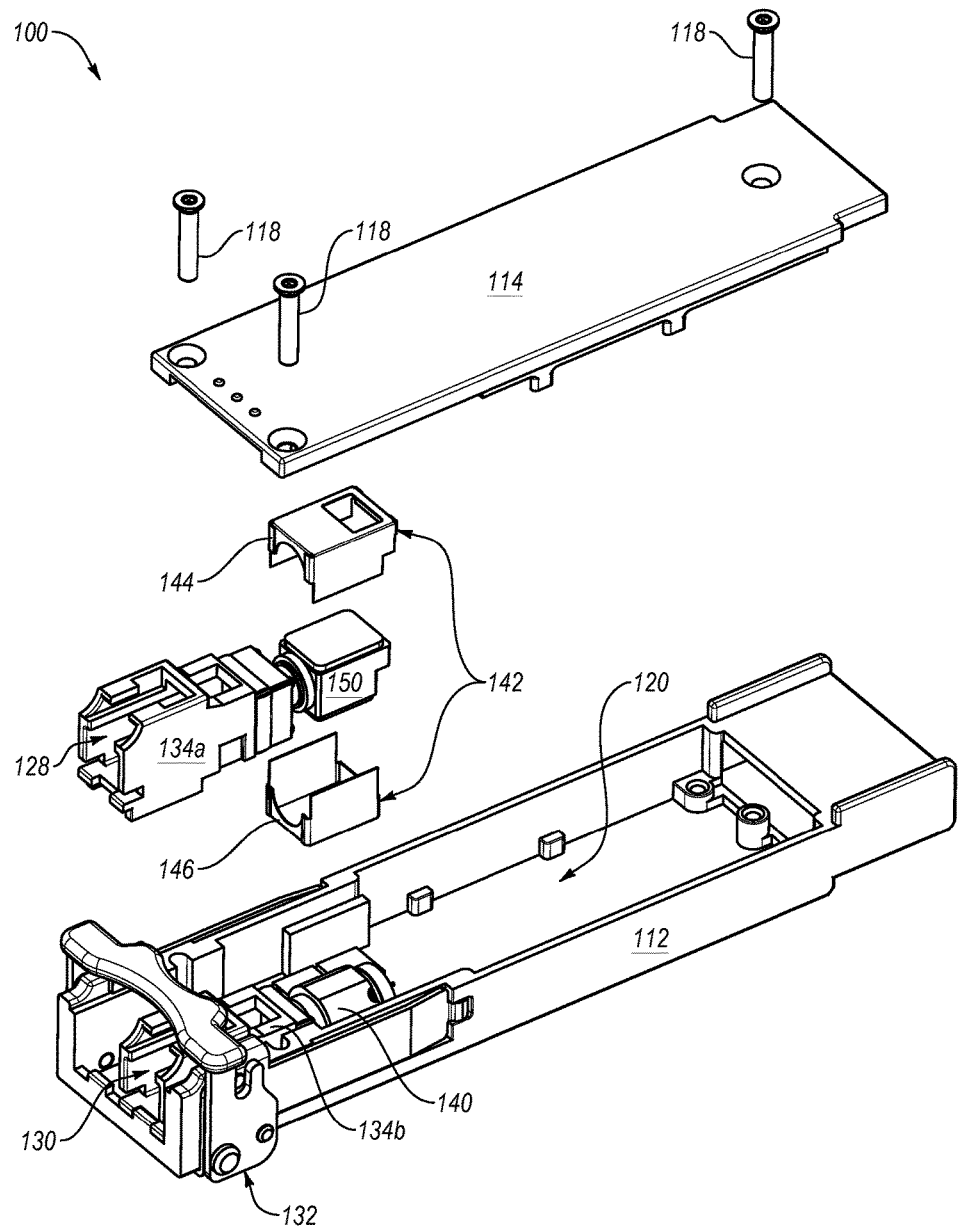
FIG. 1C shows another partially exploded perspective view of the optoelectronic transceiver module of FIG. 1A.
Figure 1D:
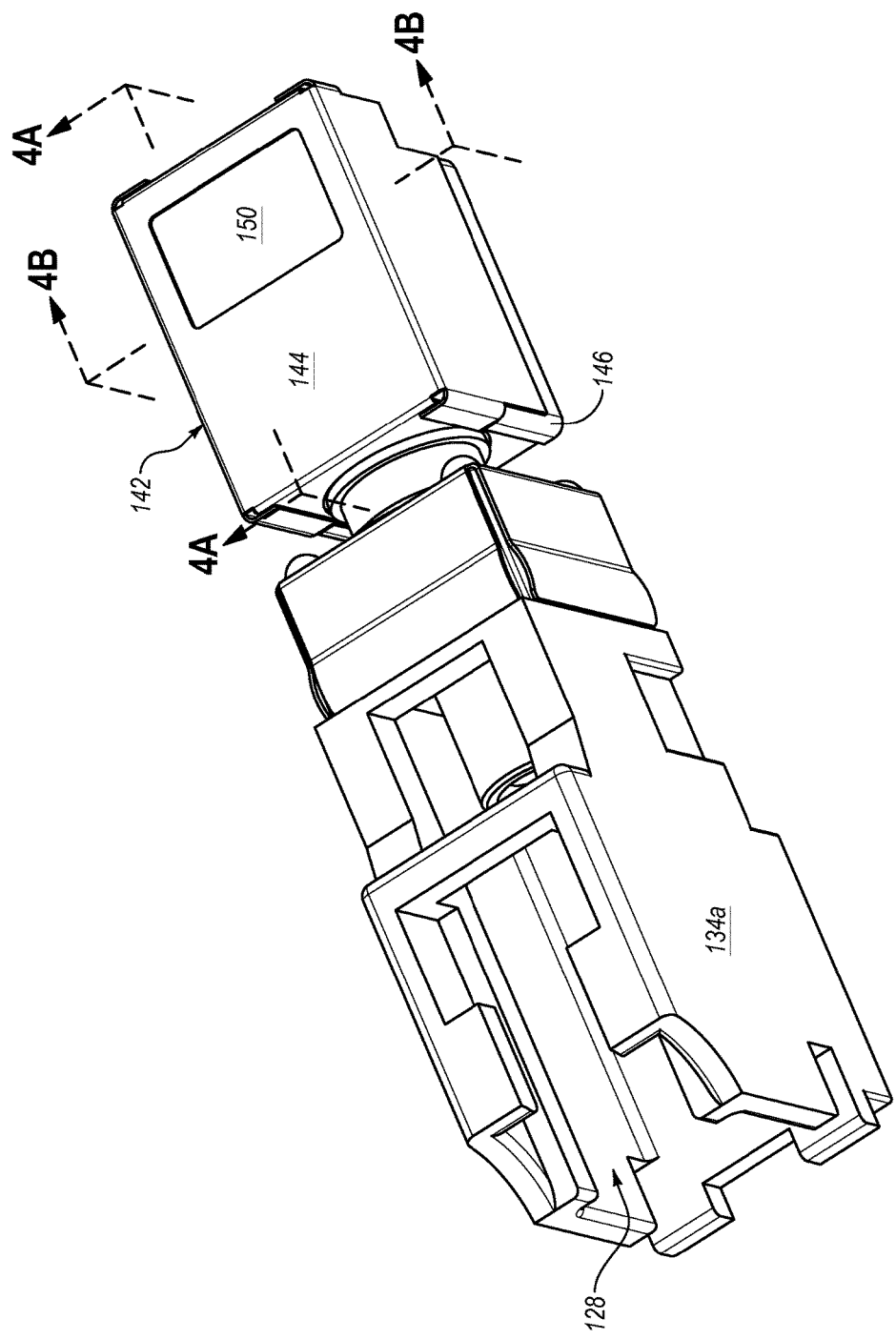
FIG. 1D shows a perspective view of a connector block, and optical subassembly, and an electromagnetic interference (EMI) shield of the optoelectronic transceiver module of FIG. 1A.

FIG. 1C shows another partially exploded view of the transceiver 100. FIG. 1D shows a perspective view of the connector block 134a, the TOSA 150, and the EMI shield 142 of the transceiver 100.

With combined reference to FIGS. 1A-1D, the transceiver 100 includes an example EMI shield 142. In the example embodiment depicted in FIGS. 1B-1D, the EMI shield 142 is positioned on the TOSA 150. Alternately or additionally, the EMI shield 142 may be positioned on the ROSA 140 and/or other optical components. In some embodiments, the EMI shield 142 and/or the ROSA 140 may be differently shaped to facilitate placement of the EMI shield 142 on the ROSA 140. The cavity 120 may house additional components for the operation of the transceiver 100. For example, the cavity 120 may also house a printed circuit board ("PCB," not shown) including transmitter circuitry and/or receiver circuitry, a connector configured to form an electrical connection with a host device, and the like. The TOSA 150 may be communicatively coupled to the PCB via a flexible circuit 151. Epoxy 153 may mechanically secure the flexible circuit 151 to the TOSA 150. The ROSA 140 may be communicatively coupled to the PCB via a flexible circuit 141.

In the example embodiment depicted in FIGS. 1A-1D, the transceiver 100 conforms to a 10 Gigabit small form factor pluggable (XFP) form factor. Alternately or additionally, embodiments may be practiced in connection with optoelectronic transceiver modules conforming to other form factors such as an enhanced small form factor pluggable (SFP+) form factor and/or configurations. In some embodiments, other communication devices may include the shield device described herein. Accordingly, a variety of communication devices and components that may benefit from the control of EMI may employ the principles described herein.

With combined reference to FIGS. 1C and 1D, the EMI shield 142 includes a first shield section 144 and a second shield section 146. FIG. 1D demonstrates how the first shield section 144 and the second shield section 146 may be configured to partially surround the TOSA 150. The shape and features of the EMI shield 142 can be modified to suit other components, applications, transceiver designs, placement locations, etc. Thus, some embodiments may include an EMI shield having a different size, shape, and/or configuration than the EMI shield 142 shown in the figures.

The EMI shield 142 may include materials of a thickness that effectively restrict or prevent the passage of EMI through the EMI shield 142. In some embodiments, the EMI shield 142 may be made of stainless steel or plated copper. However, other materials exhibiting suitable conductivity may be used.

In some embodiments, the first shield section 144 and/or the second shield section 146 may be stampings formed via sheet metal pressworking. Pressworking the first shield section 144 and/or the second shield section 146 from sheet metal may allow for relatively rapid, inexpensive, simple, and consistent manufacturing. However, manufacturing techniques such as forging, casting, and the like may alternately or additionally be used to create the first shield section 144 and/or the second shield section 146. The configuration of the EMI shield 142 may also allow for rapid, inexpensive, simple, and consistent assembly, as described in more detail below.

Figure 4A:
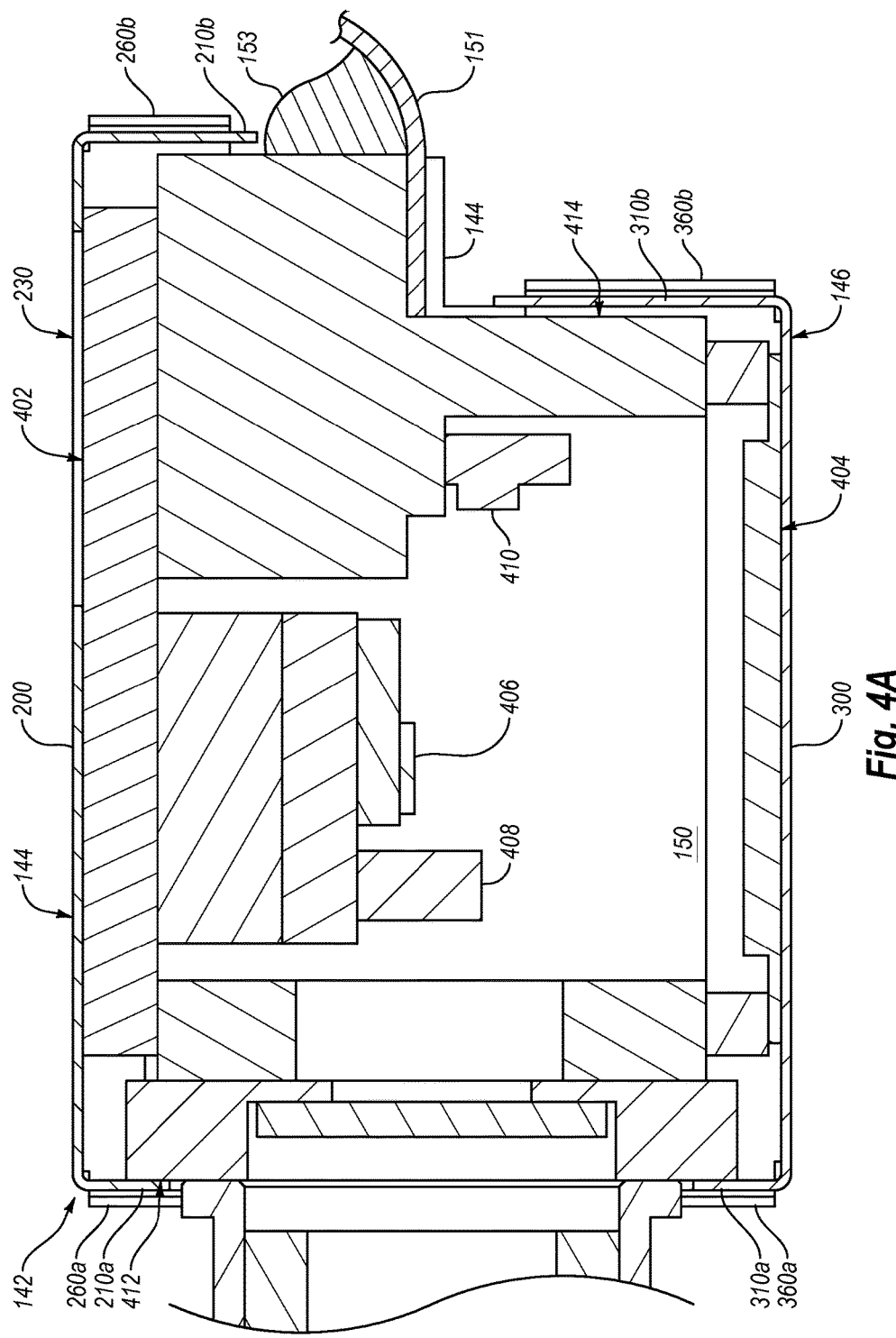
FIG. 4A shows a cross-sectional side view of the optical subassembly and the EMI shield of FIG. 1D.
Figure 4B:
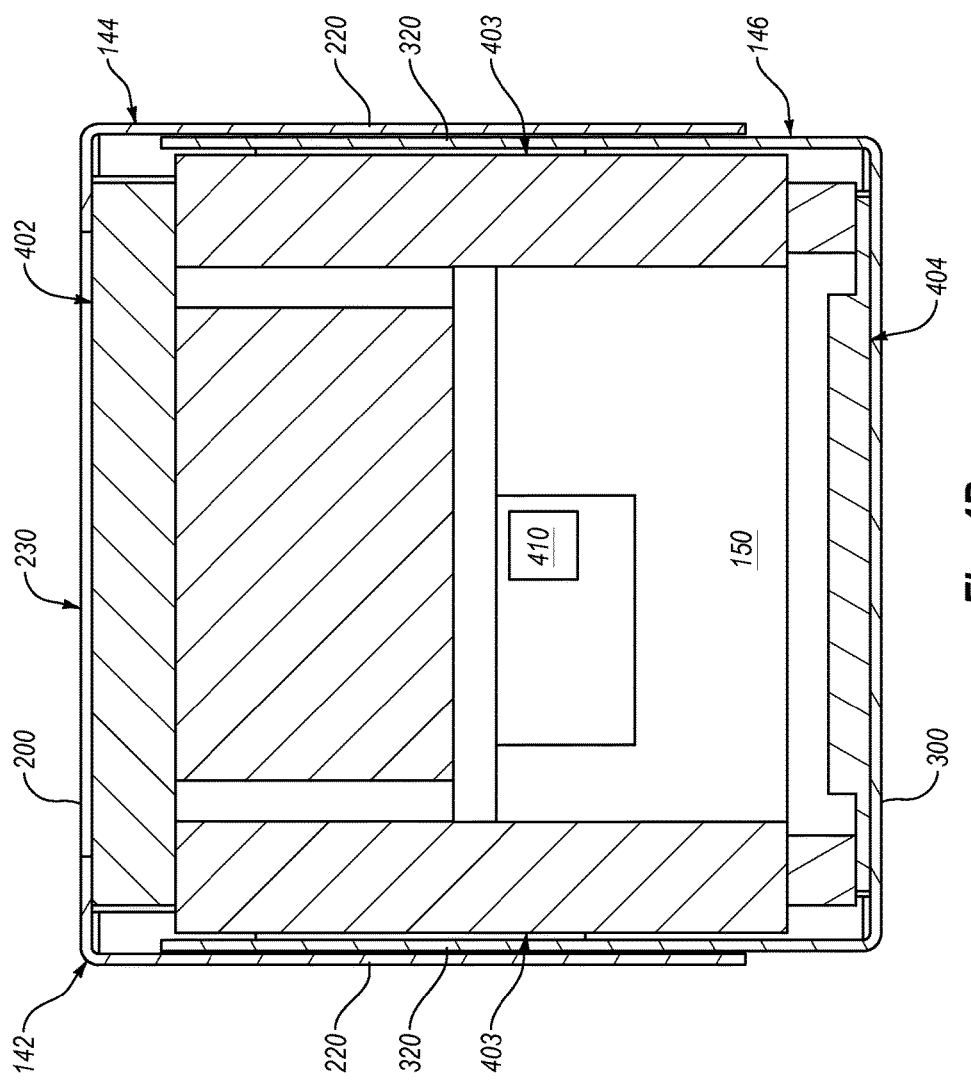
FIG. 4B shows a cross-sectional front view of the optical subassembly and the EMI shield of FIG. 1D.

FIGS. 2A-2F show various views of the first shield section 144. FIGS. 4A and 4B show cross-sectional views of the TOSA 150 and the EMI shield 142. With combined reference to FIGS. 2A-2F and FIGS. 4A-4B, in some embodiments the first shield section 144 may include a base 200. In this and other embodiments, the base 200 may be flat and rectangular in shape to fit the TOSA 150. In some embodiments, the base 200 may be otherwise shaped and sized to fit differently shaped components, such as the ROSA 140 of FIGS. 1B-1C. The base 200 may optionally include a cutout portion 230 to allow a label (not shown) on the TOSA 150 to be seen without removing the first shield section 144.

The first shield section 144 may further include arms 220 located on opposite sides of the base 200. In some embodiments, the arms 220 may be oriented perpendicular to the base 200 such that when the first shield section 144 is positioned on the TOSA 150, such as is shown in FIG. 4B, the base 200 at least partially covers a top portion 402 of the TOSA 150 and the arms 220 at least partially cover sides 403 (shown in FIG. 4B) of the TOSA 150. In this and other embodiments, the arms 220 may be flat and shaped to substantially match the shape of the sides 403 of the TOSA 150. In some embodiments, the arms 220 may be otherwise shaped and sized to fit differently shaped components, such as the ROSA 140 of FIGS. 1B-1C.

The first shield section 144 may include a flange 210a and a flange 210b (collectively "flanges 210") located on opposite sides of the base 200. In some embodiments, the flanges 210 may be oriented perpendicular to the base 200 such that when the first shield section 144 is positioned on the TOSA 150, such as is shown in FIG. 4A, the flange 210a and the flange 210b at least partially cover, respectively, a front 412 (shown in FIG. 4A) and a back 414 (shown in FIG. 4A) of the TOSA 150. In this and other embodiments, the flanges 210 may be shaped to substantially match the shape of the front 412 and the back 414 of the TOSA 150. In some embodiments, the flanges 210 may be otherwise shaped to fit differently shaped components, such as the ROSA 140 of FIGS. 1B-1C. The flanges 210 may encourage the first shield section 144 to remain positioned on the TOSA 150 and may discourage the first shield section 144 from sliding when positioned on the TOSA 150.

The first shield section 144 may include fingers 260a and fingers 260b (collectively "fingers 260"). The fingers 260 may provide a structural connection between the arms 220 and the flanges 210. The fingers 260 may be located on the arms 220. The fingers 260 may be formed to be positioned over the flanges 210 and optionally may be secured to the flanges 210. The fingers 260 may strengthen the first shield section 144, and may provide support as the first shield section 144 is assembled with the second shield section 146, as well as potentially providing extra EMI shielding.

FIGS. 3A-3F show various views of the second shield section 146. With combined reference to FIGS. 3A-3F and FIGS. 4A-4B, in some embodiments the second shield section 146 may include a base 300. In this and other embodiments, the base 300 may be flat and rectangular in shape to fit the TOSA 150. In some embodiments, the base 300 may be otherwise shaped and sized to fit differently shaped components such as the ROSA 140 of FIGS. 1B-1C.

The second shield section 146 may further include arms 320 located on opposite sides of the base 300. In some embodiments, the arms 320 may be oriented perpendicular to the base 300 such that when the second shield section 146 is positioned on the TOSA 150, such as shown in FIG. 4B, the base 300 at least partially covers a bottom portion 404 of the TOSA 150 and the arms 320 at least partially cover the sides 403 of the TOSA 150. In this and other embodiments, the arms 320 may be flat and shaped to substantially match the shape of the sides 403 of the TOSA 150. In some embodiments, the arms 320 may be otherwise shaped and sized to fit differently shaped components, such as the ROSA 140 of FIGS. 1B-1C.

The second shield section 146 may include a flange 310a and a flange 310b (collectively "flanges 310") located on opposite sides of the base 300. The flanges 310 may be oriented perpendicular to the base 300 such that when the second shield section 146 is positioned on the TOSA 150, such as is shown in FIG. 4A, the flange 310a and the flange 310b at least partially cover, respectively, the front 412 and the back 414 of the TOSA 150. In this and other embodiments, the flanges 310 may be shaped to substantially match the shape of the front 412 and the back 414 of the TOSA 150. In some embodiments, the flanges 310 may be otherwise shaped to fit differently shaped components, such as the ROSA 140 of FIGS. 1B-1C. The flanges 310 may encourage the second shield section 146 to remain positioned on the TOSA 150 and may discourage the second shield section 146 from sliding when positioned on the TOSA 150.

The second shield section 146 may include fingers 360a and fingers 360b (collectively "fingers 360"). The fingers 360 may provide a structural connection between the arms 320 and the flanges 310. The fingers 360 may be located on the arms 320. The fingers 360 may be formed to be positioned over the flanges 310 and optionally may be secured to the flanges 310. The fingers 360 may strengthen the second shield section 146, and may provide support as the second shield section 146 is assembled with the first shield section 144, as well as potentially providing extra EMI shielding.

With combined reference to FIGS. 4A and 4B, the first shield section 144 may be positioned on a top portion 402 of the TOSA 150. The second shield section 146 may be positioned on a bottom portion 404 of the TOSA 150. As may best be seen in FIG. 4B, the arms 220 of the first shield section 144 may be located on the exterior of the arms 320 of the second shield section 146. The first shield section 144 and the second shield section 146 may be sized such that the second shield section 146 is press fit into the first shield section 144, or vice versa, such that the first shield section 144 and the second shield section 146 are held in place in an interference fit when positioned on the TOSA 150. Alternately or additionally, the first shield section 144 and the second shield section 146 may be held in place in other ways, such as a snap fit, an interlocking connection, or the like. As may best be seen in FIG. 4A, the first shield section 144 and the second shield section 146 may be sized and shaped to allow clearance for the flexible circuit 151 and/or the epoxy 153 to be attached to the TOSA 150.

As may also best be seen in FIG. 4A, the TOSA 150 may include a laser 406 and a lens 408 for launching an optical signal into an optical fiber (not shown). In some instances, the TOSA 150 may include a photodiode 410 for monitoring the optical signal. The TOSA 150 may include circuitry (not shown) for transmitting and/or processing the electrical signal to be converted to the optical signal, driving the laser 406, and the like. Processing the electrical signal, driving the laser, and/or otherwise operating the TOSA 150 at high frequencies may generate electromagnetic fields that are absorbed and/or attenuated by the EMI shield 142. In turn, emission of disruptive EMI from the TOSA 150 and the transceiver 100 (FIGS. 1A-1C) may be reduced and/or practically eliminated. In some embodiments, the physical contact between the EMI shield 142 and the TOSA 150 may contribute to the electromagnetic attenuation and may reduce EMI leakage paths from the TOSA 150.

Embodiments may take other forms without departing from their spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An electromagnetic interference ("EMI") shield, comprising:
   a first shield section configured to be positioned on a first portion of an optical subassembly including a laser; and
   a second shield section configured to be positioned on a second portion of the optical subassembly, wherein the laser of the optical assembly is located between the first shield section and the second shield section,
   wherein:
      the first shield section is configured to contact the second shield section such that the first shield section and the second shield section are held in place when the first shield section and the second shield section are positioned, respectively, on the first portion and the second portion of the optical subassembly,
      the first shield section includes a first base and a first pair of arms located on the first base, the first pair of arms being configured to be at least partially positioned on opposite sides of the optical subassembly,
      the second shield section includes a second base and a second pair of arms located on the second base, the second pair of arms being configured to be at least partially positioned on the opposite sides of the optical subassembly,
      the first shield section further includes a first pair of flanges located on the first base, the first pair of flanges configured to be at least partially positioned on a front and a back of the optical subassembly, and
      the second shield section further includes a second pair of flanges located on the second base, the second pair of flanges configured to be at least partially positioned on the front and the back of the optical subassembly,
      the first shield section further includes a first plurality of fingers located on the first pair of arms, the first plurality of fingers being positioned over the first pair of flanges, and
      the second shield section further includes a second plurality of fingers located on the second pair of arms, the second plurality of fingers being positioned over the second pair of flanges.

2. The EMI shield of claim 1, wherein the first shield section and the second shield section each comprise a conductive material.

3. The EMI shield of claim 1, wherein the optical subassembly includes a transmitter optical subassembly (TOSA).

4. The EMI shield of claim 1, wherein the first shield section and the second shield section are configured to be held in place by a press fit between the first shield section and the second shield section.

5. The EMI shield of claim 1, wherein the first shield section and the second shield section are configured to be further held together by a shell and a cover of an optoelectronic transceiver module configured to house the optical subassembly.

6. The EMI shield of claim 1, wherein the first shield section includes a first stamping of pressformed sheet metal and the second shield section includes a second stamping of pressformed sheet metal.

7. An optoelectronic transceiver module, comprising:
a transceiver body that includes a shell and a cavity formed in the shell;
a transmitter optical subassembly (TOSA) connected to the transceiver body by way of a connector block;
a cover configured to cover the cavity and attach to the shell; and
an electromagnetic interference ("EMI") shield at least partially covering the TOSA, the EMI shield including:
a first shield section configured to be positioned on a first portion of the TOSA; and
a second shield section configured to be positioned on a second portion of the TOSA,
wherein a laser of the TOSA is located between the first shield section and the second shield section, and
wherein the first shield section is configured to contact the second shield section such that the first shield section and the second shield section are held in place when the first shield section and the second shield section are positioned, respectively, on the first portion and the second portion of the TOSA,
the first shield section includes a first base and a first pair of arms located on the first base, the first pair of arms being configured to be at least partially positioned on opposite sides of the optical subassembly,
the second shield section includes a second base and a second pair of arms located on the second base, the second pair of arms being configured to be at least partially positioned on the opposite sides of the optical subassembly,
the first shield section further includes a first pair of flanges located on the first base, the first pair of flanges configured to be at least partially positioned on a front and a back of the optical subassembly, and
the second shield section further includes a second pair of flanges located on the second base, the second pair of flanges configured to be at least partially positioned on the front and the back of the optical subassembly,
the first shield section further includes a first plurality of fingers located on the first pair of arms, the first plurality of fingers being positioned over the first pair of flanges, and
the second shield section further includes a second plurality of fingers located on the second pair of arms, the second plurality of fingers being positioned over the second pair of flanges.

8. The optoelectronic transceiver module of claim 7, wherein the first shield section and the second shield section comprise a conductive material.

9. The optoelectronic transceiver module of claim 7, wherein the first shield section and the second shield section are configured to be further held together, at least in part, by the shell and the cover.

10. The optoelectronic transceiver module of claim 7, wherein the first shield section includes a first stamping of pressformed of stamped sheet metal and the second shield section includes a second stamping of pressformed sheet metal.

11. An electromagnetic interference ("EMI") shield, comprising:
a first shield section configured to be positioned on a first portion of an optical subassembly including a photodiode, the first shield section including:
a first base;
a first pair of arms located on the first base, the first pair of arms being configured to be at least partially positioned on opposite sides of the optical subassembly;
a first pair of flanges located on the first base, the first pair of flanges configured to be at least partially positioned on a front and a back of the optical subassembly; and
a first plurality of fingers located on the first pair of arms, the first plurality of fingers being positioned over the first pair of flanges; and
a second shield section configured to be positioned on a second portion of the optical subassembly, wherein the photodiode of the optical subassembly is located between the first shield section and the second shield section, the second shield section including:
a second base;
a second pair of arms located on the second base, the second pair of arms being configured to be at least partially positioned on the opposite sides of the optical subassembly;
a second pair of flanges located on the second base, the second pair of flanges configured to be at least partially positioned on the front and the back of the optical subassembly; and
a second plurality of fingers located on the second pair of arms, the second plurality of fingers being positioned over the second pair of flanges,
wherein the first shield section and the second shield section are together configured to form a press fit.

12. The EMI shield of claim 11, wherein the optical subassembly includes a transmitter optical subassembly (TOSA) including a laser configured to generate an optical signal and wherein the photodiode is configured to monitor the optical signal.

13. The EMI shield of claim 11, wherein the first shield section and the second shield section comprise a conductive material.

14. The EMI shield of claim 11, wherein the first shield section includes a first stamping of pressformed sheet metal and the second shield section includes a second stamping of pressformed sheet metal.

* * * * *